(12) United States Patent
Son et al.

(10) Patent No.: US 10,586,828 B2
(45) Date of Patent: Mar. 10, 2020

(54) LIGHT EMITTING ELEMENT AND ELECTRON BEAM DEPOSITION APPARATUS FOR MANUFACTURING SAME

(71) Applicant: LG INNOTEK CO., LTD., Seoul (KR)

(72) Inventors: Su Hyoung Son, Seoul (KR); Keon Hwa Lee, Seoul (KR); Byeong Kyun Choi, Seoul (KR); Kwang Ki Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/540,701

(22) PCT Filed: Dec. 30, 2015

(86) PCT No.: PCT/KR2015/014455
§ 371 (c)(1),
(2) Date: Jun. 29, 2017

(87) PCT Pub. No.: WO2016/117845
PCT Pub. Date: Jul. 28, 2016

(65) Prior Publication Data
US 2018/0090539 A1   Mar. 29, 2018

(30) Foreign Application Priority Data

Jan. 21, 2015   (KR) .................... 10-2015-0009753

(51) Int. Cl.
*H01L 33/46* (2010.01)
*H01L 27/15* (2006.01)
(Continued)

(52) U.S. Cl.
CPC ............ *H01L 27/156* (2013.01); *H01L 24/24* (2013.01); *H01L 33/005* (2013.01); *H01L 33/06* (2013.01);
(Continued)

(58) Field of Classification Search
None
See application file for complete search history.

(56) References Cited

U.S. PATENT DOCUMENTS

| | | | |
|---|---|---|---|
| 5,612,231 | A | 3/1997 | Holm et al. |
| 2011/0210352 | A1 | 9/2011 | Lee et al. |

(Continued)

FOREIGN PATENT DOCUMENTS

| | | |
|---|---|---|
| CN | 101452988 A | 6/2009 |
| CN | 101515621 A | 8/2009 |

(Continued)

*Primary Examiner* — Ali Naraghi
(74) *Attorney, Agent, or Firm* — Birch, Stewart, Kolasch & Birch, LLP

(57) ABSTRACT

A light emitting element of an embodiment may comprise: a light emitting structure including a first conductive type semiconductor layer, an active layer, and a second conductive type semiconductor layer, and first and second electrodes placed on the first and second conductive semiconductor layers respectively, wherein the light emitting structure includes a first mesa region, the first conductive type semiconductor layer includes a second mesa region, and the first electrode includes: a first region which is a partial region of the upper surface of the second mesa region; a second region which is the side surface of the second mesa region; and a third region arranged to extend from the edge of the side surface of the second mesa region, wherein the first, second, and third regions are formed such that the thickness of the first region (d1), the second region (d2), and the third region (d3) have a ratio of $d1:d2:d3 = 1:0.9 \sim 1.1:1$.

12 Claims, 6 Drawing Sheets

(51) Int. Cl.
  *H01L 33/38*    (2010.01)
  *H01L 23/00*    (2006.01)
  *H01L 33/00*    (2010.01)
  *H01L 33/06*    (2010.01)
  *H01L 33/10*    (2010.01)
  *H01L 33/20*    (2010.01)
  *H01L 33/30*    (2010.01)
  *H01L 33/40*    (2010.01)
  *H01L 33/42*    (2010.01)
  *H01L 33/44*    (2010.01)
  *H01L 33/62*    (2010.01)
  *H01L 21/67*    (2006.01)

(52) U.S. Cl.
  CPC .............. *H01L 33/10* (2013.01); *H01L 33/20* (2013.01); *H01L 33/30* (2013.01); *H01L 33/38* (2013.01); *H01L 33/385* (2013.01); *H01L 33/405* (2013.01); *H01L 33/42* (2013.01); *H01L 33/44* (2013.01); *H01L 33/62* (2013.01); *H01L 21/67161* (2013.01); *H01L 2933/0016* (2013.01)

(56) References Cited

U.S. PATENT DOCUMENTS

| | | | |
|---|---|---|---|
| 2012/0080695 A1* | 4/2012 | Lee | H01L 27/156 257/91 |
| 2014/0353692 A1* | 12/2014 | Oh | H01L 33/385 257/88 |
| 2015/0034900 A1 | 2/2015 | Aihara | |
| 2016/0190396 A1* | 6/2016 | Lee | H01L 33/382 257/13 |
| 2016/0307959 A1* | 10/2016 | Zhang | H01L 27/156 |

FOREIGN PATENT DOCUMENTS

| | | |
|---|---|---|
| EP | 1 590 834 A1 | 11/2005 |
| JP | 2002-289920 A | 10/2002 |
| JP | 2013-128071 A | 6/2013 |
| KR | 2003-0076020 A | 9/2003 |
| KR | 10-2005-0109767 A | 11/2005 |
| KR | 10-2009-0053435 A | 5/2009 |
| KR | 10-0966372 B1 | 6/2010 |
| KR | 10-2011-0098874 A | 9/2011 |

\* cited by examiner

【FIG. 1】
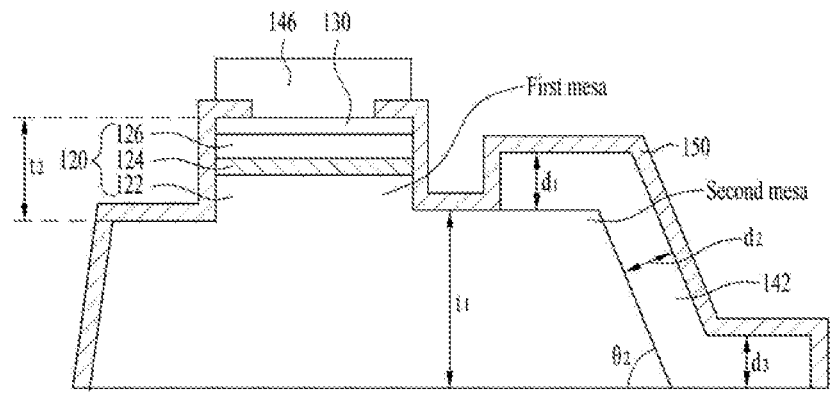
【FIG. 2】
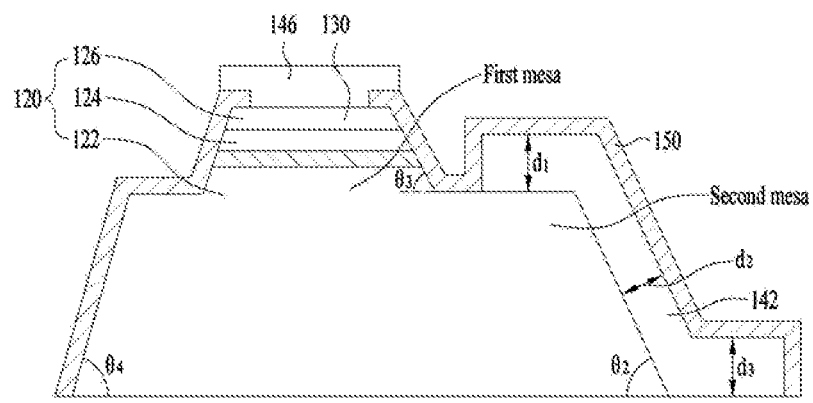
【FIG. 3A】
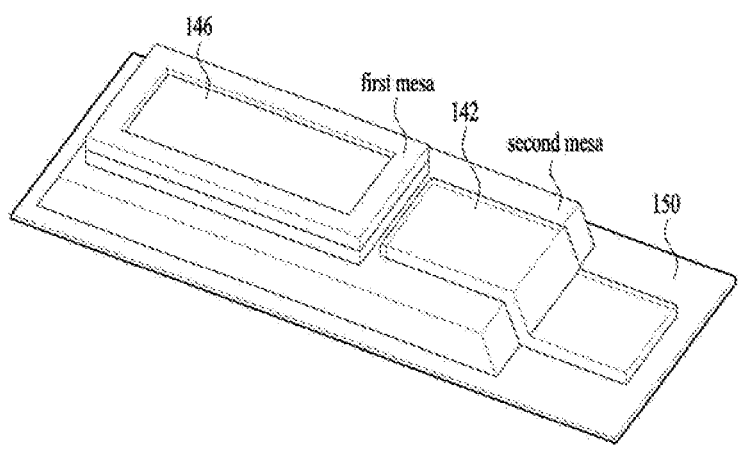

[FIG. 3B]
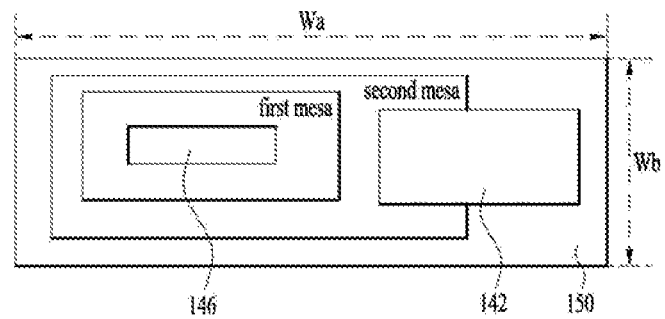
[FIG. 4]
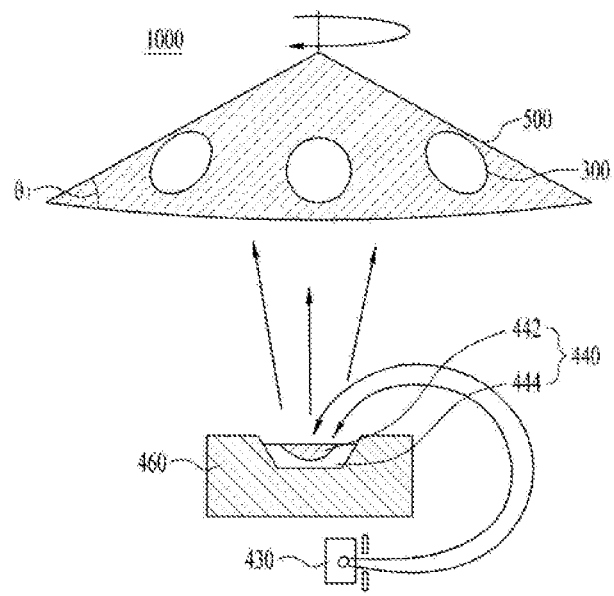
[FIG. 5]
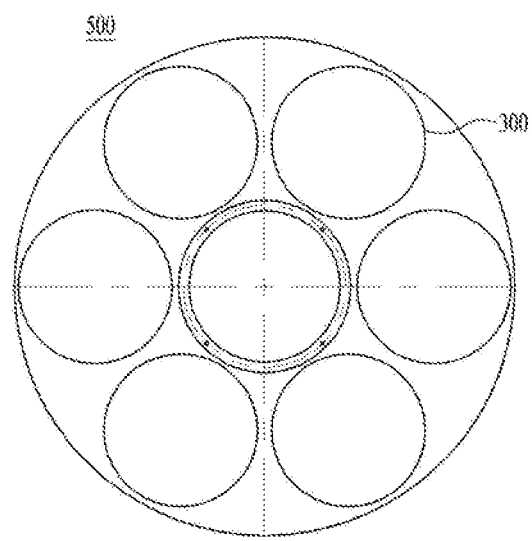

【FIG. 6】
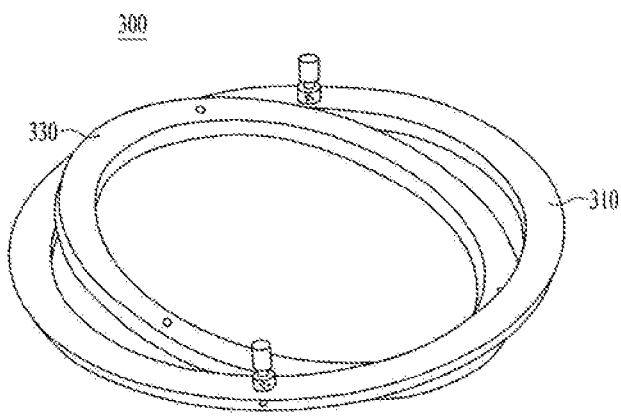
【FIG. 7】
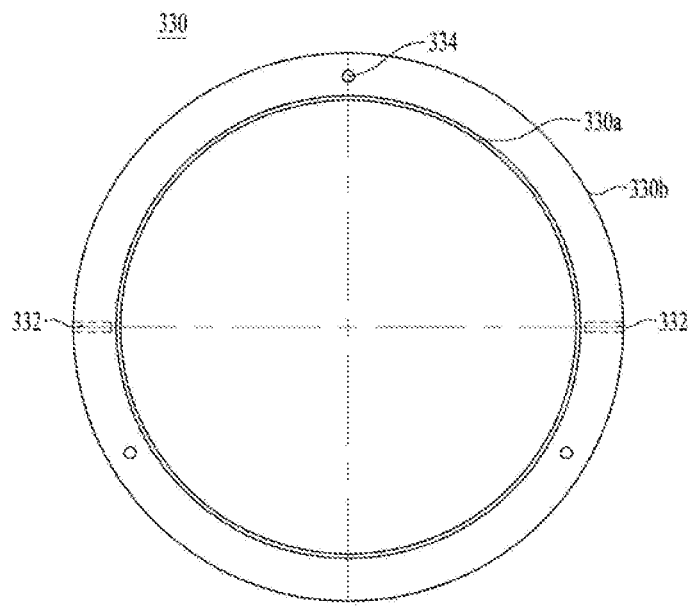

[FIG. 8]
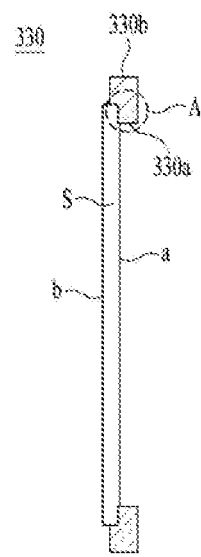
[FIG. 9]
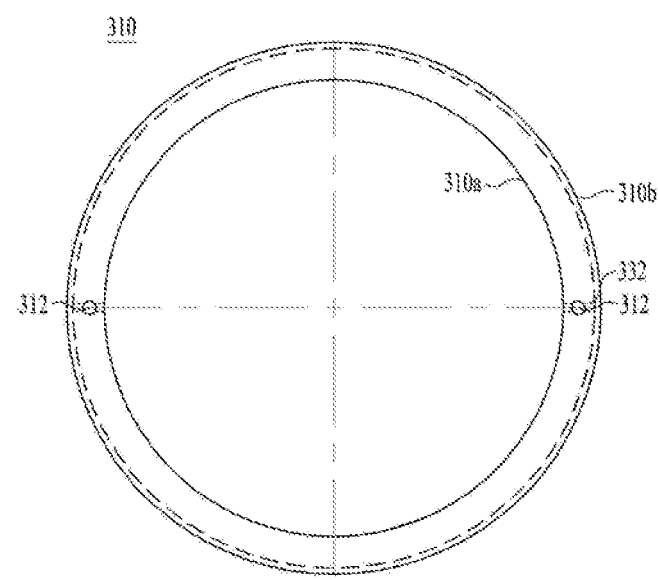

【FIG. 10】
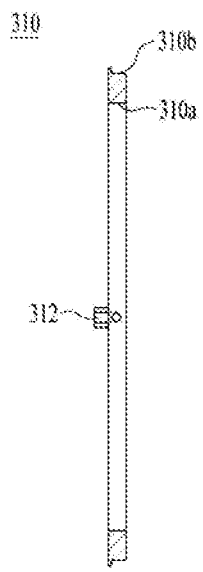
【FIG. 11】
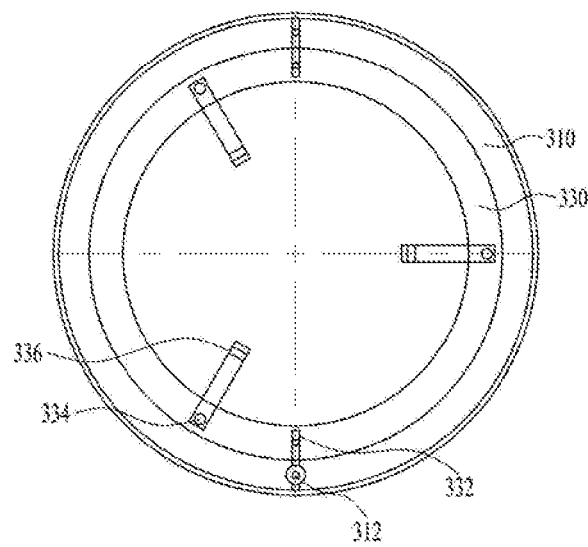

【FIG. 12】
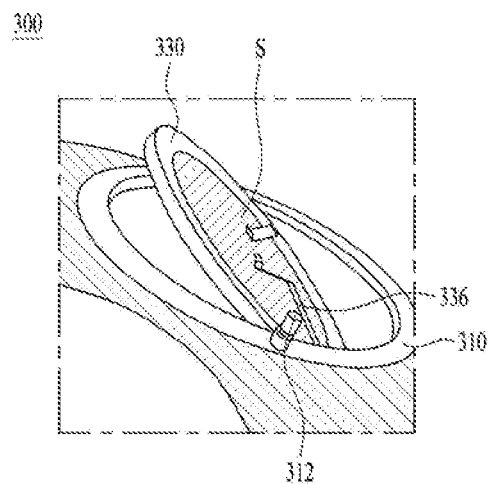
【FIG. 13】
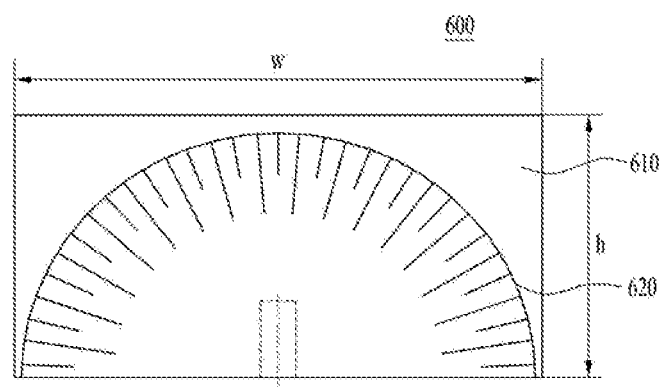
【FIG. 14】
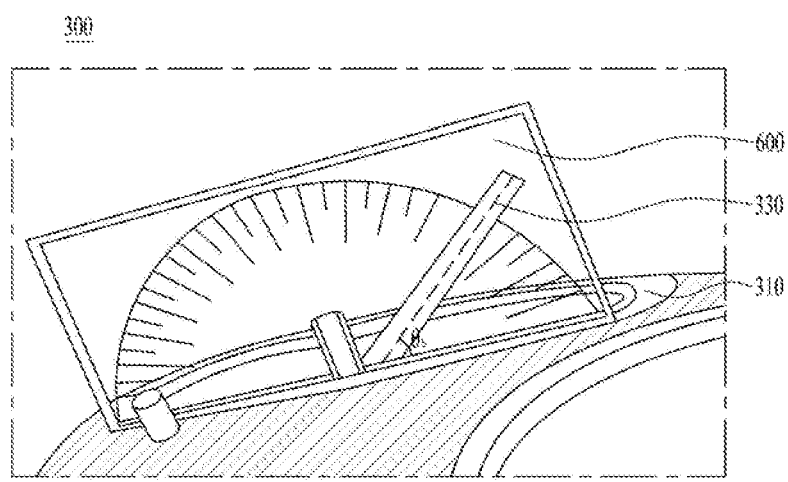

LIGHT EMITTING ELEMENT AND ELECTRON BEAM DEPOSITION APPARATUS FOR MANUFACTURING SAME

CROSS REFERENCE TO RELATED APPLICATIONS

This application is the National Phase of PCT International Application No. PCT/KR2015/014455, filed on Dec. 30, 2015, which claims priority under 35 U.S.C. 119(a) to Patent Application No. 10-2015-0009753, filed in the Republic of Korea on Jan. 21, 2015, all of which are hereby expressly incorporated by reference into the present application.

TECHNICAL FIELD

Embodiments relate to a light emitting element and an electron beam deposition apparatus for forming an electrode layer of the light emitting element.

BACKGROUND ART

Group III-V compound semiconductors such as, for example, GaN and AlGaN, are widely used for optoelectronics and electronic elements owing to many advantages such as, for example, a wide and easily adjustable band gap energy.

In particular, light emitting elements such as light emitting diodes or laser diodes using group III-V or II-VI compound semiconductors may realize various colors of light such as, for example, red, green, and blue light, as well as ultraviolet light, via the development of element materials and thin-film growth technique, and may also realize white light having high luminous efficacy via the use of a fluorescent material or by combining colors. These light emitting elements have advantages of low power consumption, a semi-permanent lifespan, fast response speed, good safety, and eco-friendly properties compared to existing light sources such as, for example, fluorescent lamps and incandescent lamps.

Accordingly, the application of light emitting elements has been expanded to a transmission module of an optical communication apparatus, a light emitting diode backlight, which may substitute for a cold cathode fluorescent lamp (CCFL) constituting a backlight of a liquid crystal display (LCD) apparatus, a white light emitting diode lighting apparatus, which may substitute for a fluorescent lamp or an incandescent bulb, a vehicle headlight, and a signal lamp.

In addition, light emitting diodes having excellent optical characteristics and a small size have recently been developed because the application thereof to light sources of, for example, portable appliances or lighting apparatuses is on the rise.

Although attempts have been made to form a pixel by reducing the cross-sectional area of a light emitting structure in order to realize a small light emitting diode, the thickness of each light emitting structure is too large to realize a super-thin-type unit pixel.

That is, the light emitting structure of the light emitting diode described above is grown on a substrate formed of, for example, sapphire. For example, in the case of a horizontal-type light emitting element in which the substrate remains after the light emitting structure is grown and a vertical-type light emitting element in which a metal support is coupled to one side of the light emitting structure and the substrate is removed, the substrate or the metal support is too thick to form a super-thin-type pixel.

In addition, a small light emitting element used in a super-thin-type pixel may be deteriorated in performance when the step coverage of a semiconductor layer or a metal layer, which is provided on a stepped portion, is poor.

Technical Object

Therefore, embodiments are provided to realize a super-thin-type light emitting element, which has improved deposition quality of a metal layer owing to an improved structure of a substrate holder provided in an electron beam deposition apparatus.

Technical objects to be achieved by the embodiments are not limited to the technical object as mentioned above, and other unmentioned technical objects will be clearly understood by those skilled in the art from the following description.

Technical Solution

An embodiment provides a light emitting element including a light emitting structure including a first conductive semiconductor layer, an active layer, and a second conductive semiconductor layer, and first and second electrodes disposed respectively on the first and second conductive semiconductor layers, wherein the light emitting structure includes a first mesa area, and the first conductive semiconductor layer includes a second mesa area, wherein the first electrode includes a first area on a portion of an upper surface of the second mesa area, a second area on a side surface of the second mesa area, and a third area disposed so as to extend from an edge of the side surface of the second mesa area, and wherein the first area, the second area, and the third area have a thickness ratio as follows:

$d1: d2: d3 = 1:0.9\sim1.1:1$ (where $d1$ s a thickness of the first area, $d2$ is a thickness of the second area, and $d3$ is a thickness of the third area.

Another embodiment provides an electron beam deposition apparatus of forming a first electrode, the apparatus including a thermal electron emitter, a source feeder including a deposition material to be evaporated by a thermal electron supplied from the thermal electron emitter, and a dome unit spaced apart from and disposed above the source feeder, wherein the dome unit includes a plurality of substrate holders, and wherein each of the substrate holders includes a variable jig, an inclination angle of which is adjusted.

Advantageous Effects

An electron beam deposition apparatus of embodiments includes a variable jig, thereby being capable of freely adjusting the angle at which a substrate is disposed so as to be fixed to a substrate holder. When such an electron beam deposition apparatus is used, the substrate may be obliquely tilted relative to a source, which is supplied upon deposition of a metal layer, whereby a light emitting element may achieve improved step coverage at a stepped layer thereof.

DESCRIPTION OF DRAWINGS

FIGS. 1 and 2 are views illustrating an embodiment of a light emitting element.

FIG. 3A is a perspective view illustrating the light emitting element of the embodiment.

FIG. 3B is a plan view illustrating the light emitting element of the embodiment.

FIG. 4 is a view illustrating an embodiment of an electron beam deposition apparatus.

FIG. 5 is a view illustrating the upper surface of a dome unit.

FIG. 6 is a view illustrating an embodiment of a substrate holder unit.

FIGS. 7 and 8 are views illustrating an embodiment of a variable jig.

FIGS. 9 and 10 are views illustrating an embodiment of a stationary jig.

FIG. 11 is a view illustrating an embodiment of a substrate holder.

FIG. 12 is a view illustrating a portion of the dome unit including the substrate holder of the embodiment.

FIG. 13 is a view illustrating an embodiment of an angle measurement device.

FIG. 14 is a view illustrating a portion of the dome unit to which the angle measurement device of the embodiment is attached.

BEST MODE

Hereinafter, embodiments will be described in detail with reference to the accompanying drawings, in order to concretely realize the above object.

In the description of the embodiments disclosed here, it will be understood that, when an element is referred to as being formed "on" or "under" another element, it can be directly "on" or "under" the other element or be indirectly formed with intervening one or more elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

In the drawings, the thickness or size of each layer may be exaggerated, omitted or schematically illustrated for clarity and convenience. In addition, the size of each constituent element does not wholly reflect an actual size thereof.

FIGS. 1 and 2 are views illustrating an embodiment of a light emitting element.

The light emitting element of the embodiment may include a light emitting structure 120 including a first conductive semiconductor layer 122, an active layer 124, and a second conductive semiconductor layer 126, and a first electrode 142 and a second electrode 146 disposed respectively on the first and second conductive semiconductor layers.

Referring to FIGS. 1 and 2, the light emitting structure 120 may include at least one mesa area. Here, the mesa area corresponds to the area including the upper surface and the side surface of a structure that is formed by mesa etching.

The light emitting structure may include a first mesa area, and the first conductive semiconductor layer may include a second mesa area.

For example, in FIGS. 1 and 2, the first mesa area may include the first conductive semiconductor layer 122, the active layer 124, and the second conductive semiconductor layer 126, and the second mesa area may include only the first conductive semiconductor layer 122. In addition, the first mesa area may be disposed on the second mesa area.

The light emitting structure 120 may include the first conductive semiconductor layer 122, the active layer 124 on the first conductive semiconductor layer, and the second conductive semiconductor layer 126 disposed on the active layer.

The first conductive semiconductor layer 122 may be formed of compound semiconductors such as, for example, group III-V or II-Vi compound semiconductors, and may be doped with a first conductive dopant. The first conductive semiconductor layer 122 may be formed of a semiconductor material having a composition equation of $Al_xIn_yGa_{(1-x-y)}N$ ($0 \leq x \leq 1$, $0 \leq y \leq 1$, $0 \leq x+y \leq 1$), and for example, may be formed of any one or more of AlGaN, GaN, InAlGaN, AlGaAs, GaP, GaAs, GaAsP, and AlGaInP.

When the first conductive semiconductor layer 122 is an n-type semiconductor layer, the first conductive dopant may include an n-type dopant such as, for example, Si, Ge, Sn, Se, or Te. The first conductive semiconductor layer 122 may be formed in a single layer or in multiple layers, without being limited thereto.

The active layer 124 may be disposed on the first conductive semiconductor layer 122.

The active layer 124 may be disposed between the first conductive semiconductor layer 122 and the second conductive semiconductor layer 126, and may include any one of a single well structure (a double hetero structure), a multi-well structure, a single quantum well structure, a multi quantum well (MOW) structure, a quantum dot structure, and a quantum line structure.

The active layer 324 may have any one or more pair structures of a well layer and a barrier layer using group III-V compound semiconductors, for example, AlGaN/AlGaN, InGaN/GaN, InGaN/InGaN, AlGaN/GaN, InAlGaN/GaN, GaAs(InGaAs)/AlGaAs, and GaP(InGaP)/AlGaP, without being limited thereto. The well layer may be formed of a material, which has a smaller energy band gap than the energy band gap of the barrier layer.

The second conductive semiconductor layer 126 may be formed on the surface of the active layer 124 using compound semiconductors. The second conductive semiconductor layer 126 may be formed of, for example, group III-V or II-VI compound semiconductors, and may be doped with a second conductive dopant. The second conductive semiconductor layer 126 may be formed of a semiconductor material having a composition equation of $In_xAl_yGa_{(1-x-y)}N$ ($0 \leq x \leq 1$, $0 \leq y \leq 1$, $0 \leq x+y \leq 1$), and may be formed of any one or more of AlGaN, GaN, AlInN, AlGaAs, GaP, GaAs, GaAsP, and AlGaInP. For example, the second conductive semiconductor layer 126 may be formed of $Al_xGa_{(1-x)}N$.

When the second conductive semiconductor layer 126 is a p-type semiconductor layer, the second conductive dopant may be a p-type dopant such as, for example, Mg, Zn, Ca, Sr or Ba. The second conductive semiconductor layer 126 may be formed in a single layer or in multiple layers, without being limited thereto.

A conductive layer 130 may further be disposed on the second conductive semiconductor layer 126.

The conductive layer 130 may improve the electrical characteristics of the second conductive semiconductor layer 126, and may improve the electrical contact between the second conductive semiconductor layer 126 and the second electrode 146. The conductive layer 130 may be formed in multiple layers or may have a pattern. The conductive layer 130 may be configured as a transparent electrode layer having a light-transmitting property.

The conductive layer 130 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), zinc oxide (ZnO), iridium oxide (IrOx), ruthenium oxide (RuOx), nickel oxide (NiO), RuOx/ITO, and Ni/IrOx/Au (Gold), and is not limited to these materials.

The first electrode 142 and the second electrode 146 may be disposed respectively on the first conductive semiconductor layer 122 and the second conductive semiconductor layer 126.

The first electrode 142 and the second electrode 146 may be formed in a single layer or in multiple layers using a conductive material, for example, a metal or an alloy selected from among indium (In), cobalt (Co), silicon (Si), germanium (Ge), gold (Au), palladium (Pd), platinum (Pt), ruthenium (Ru), rhenium (Re), magnesium (Mg), zinc (Zn), hafnium (Hf), tantalum (Ta), rhodium (Rh), iridium (Ir), tungsten (W), titanium (Ti), silver (Ag), chrome (Cr), molybdenum (Mo), niobium (Nb), aluminum (Al), nickel (Ni), copper (Cu), and titanium tungsten alloy (WTi), without being limited thereto.

The first electrode 142 may be disposed on a portion of the second mesa area. That is, the first electrode 142 may be disposed on a portion of the first conductive semiconductor layer 122 that is exposed by mesa etching.

In the embodiment of FIGS. 1 and 2, the first electrode 142 may be formed on a portion of the upper surface of the first conductive semiconductor layer 122, i.e. the upper surface of the second mesa area and on the side surface of the second mesa area so as to extend from the edge of the second mesa area.

In an embodiment of the light emitting element, the first electrode 142 may be formed using an electron beam deposition apparatus of an embodiment, which will be described below. That is, a metal layer of the first electrode 142 may be formed using an electron beam deposition apparatus having a variable jig according to an embodiment.

The first electrode may include a first area disposed on a portion of the upper surface of the second mesa area, a second area disposed on the side surface of the second mesa area, and a third area disposed so as to extend from the edge of the side surface of the second mesa area, and the thickness ratio of the first area to the third area of the first electrode may be as follows:

d1:d2:d3=1:0.9~1.1:1 where d1 may be the thickness of the first area, d2 may be the thickness of the second area, and d3 may be the thickness of the third area.

For example, the thicknesses d1 and d3 of the first area and the third area of the first electrode layer may be about 1 μm, and the thickness d2 of the second area may range from 0.9 μm to 1.1 μm.

When the metal layer of the first electrode is deposited using the electron beam deposition apparatus, which will be described below, a substrate including a deposition surface may be tilted in order to allow an evaporated deposition metal material to easily reach a stepped portion of the light emitting element that is formed by the second mesa area. Therefore, the first electrode layer having a stepped portion may be formed to have an even thickness in its entirety.

That is, the first electrode layer, which is formed on the upper surface and the side surface of the second mesa area and extends from the edge of the side surface, may have an even thickness.

In addition, in the embodiment of the electron beam deposition apparatus, which will be described below, when a variable jig is fixed to have an inclination angle within a range from 30 degrees to 45 degrees relative to a stationary jig, the first electrode layer may exhibit good step coverage, and thus may have an even electrode-layer thickness.

The first electrode 142 may include an ohmic layer, a reflective layer, and a coupling layer. The ohmic layer of the first electrode may be formed of chrome (Cr) or silver (Ag), the reflective layer may be formed of any one or an alloy of platinum (Pt) and gold (Au), nickel (Ni) and gold (Au), aluminum (Al) and platinum (Pt), gold (Au) and aluminum (Al), and nickel (Ni) and gold (Au), and the coupling layer may be formed of titanium (Ti).

The ohmic layer of the first electrode 142 may facilitate the easy coupling between the first conductive semiconductor layer 122 and the reflective layer, and the coupling layer may be formed for the coupling between the reflective layer and an insulation layer 150.

Meanwhile, the first electrode 142 may be disposed so that a first surface thereof comes into contact with the insulation layer 150, which will be described below, and a portion of the second surface facing the first surface is exposed outward.

In the embodiment of FIGS. 1 and 2, the second electrode 146 may be disposed on the second conductive semiconductor layer 126.

In addition, when the conductive layer 130 is further provided on the second conductive semiconductor layer 126, the second electrode 146 may be disposed on the conductive layer 130.

Meanwhile, when the second electrode 146 is formed using an electron beam deposition apparatus, which will be described below, the variable jig may be fixed to the stationary jig at an inclination angle less than 30 degrees.

That is, in the electron beam deposition apparatus of the embodiment, the inclination angle of the variable jig may be adjusted according to the shape of the metal layer to be deposited.

The second electrode 146 may include an ohmic layer and a reflective layer.

The ohmic layer of the second electrode may be formed of chrome, silver or titanium. The ohmic layer may facilitate the coupling between the conductive layer and the reflective layer.

In addition, the reflective layer of the second electrode may be any one or an alloy of platinum (Pt) and gold (Au), nickel (Ni) and gold (Au), aluminum (Al) and platinum (Pt), gold (Au) and aluminum (Al), and nickel (Ni) and gold (Au).

In the embodiment of FIGS. 1 and 2, the insulation layer 150 may be disposed on the light emitting structure 120, which is exposed between the first electrode 142 and the second electrode 146.

In addition, the insulation layer 150 may be disposed on the exposed surface of the light emitting structure 120 and the first electrode 142.

The insulation layer 150 may be disposed on the first mesa area and the second mesa area of the light emitting structure 120, and may include an open area configured to expose the second conductive semiconductor layer 126 on the first mesa area.

In addition, on the first mesa area, at least a portion of the second conductive semiconductor layer 126, the insulation layer 150 and the second electrode 146 may overlap each other at the outer periphery of the open area in which the second conductive semiconductor layer 126 or the conductive layer 130 is exposed.

Meanwhile, at least a portion of the second electrode 146 may be disposed on the open area. Here, the second electrode 146 may come into contact with the second conductive semiconductor layer 126.

The insulation layer 150 may be formed of an insulation material in order to prevent the electrical contact between the first conductive semiconductor layer 122 and the second conductive semiconductor layer 126.

The insulation layer 150 may be formed of, for example, $SiO_2$, $Si_3N_4$, or polyimide.

In addition, the insulation layer 150 may be formed of a material having high reflectivity in order to increase the efficiency with which light is emitted from the light emitting structure, and may have, for example, a DBR structure.

Referring to FIG. 1, the side surface of the second mesa area may be inclined relative to the bottom surface of the first conductive semiconductor layer 122.

For example, the inclination angle θ2 of the side surface of the second mesa area relative to the bottom surface of the first conductive semiconductor layer may be greater than 50 degrees and less than 90 degrees. Specifically, the inclination angle θ2 may range from 70 degrees to 80 degrees.

In addition, the height of the first conductive semiconductor layer that forms the second mesa area, i.e. the height t1 from the bottom surface of the first conductive semiconductor layer to the upper surface of the second mesa area may be about 2 μm.

Although the side surface of the first mesa area is illustrated as being close to vertical in FIG. 1, the embodiment is not limited thereto, and the side surface of the first mesa area may be obliquely inclined at a predetermined angle relative to the bottom surface of the light emitting element.

Referring to FIG. 2, the side surface of the first mesa area may be inclined relative to the upper surface of the second mesa area.

For example, the inclination angle θ3 of the side surface of the first mesa area relative to the upper surface of the second mesa area may range from 70 degrees to 90 degrees. Meanwhile, the inclination angle of the side surface of the first mesa area relative to the upper surface of the second mesa area may be the same as the inclination angle of the side surface of the first mesa area relative to the bottom surface of the first conductive semiconductor layer.

In addition, in the embodiment of FIG. 2, with regard to the inclination angle of the side surface of the second mesa area relative to the bottom surface of the first conductive semiconductor layer, the inclination angle θ2 in the portion in which the first electrode is disposed and the inclination angle θ4 in the portion in which no first electrode is disposed may be the same. For example, the inclination angles θ2 and θ4 of the side surface of the second mesa area relative to the bottom surface of the first conductive semiconductor layer at opposite sides may range from 70 degrees to 80 degrees.

When the second mesa area is formed by a dry etching process, it may be difficult to reduce an inclination angle of the side surface that is less than 70 degrees due to processing. In addition, when the inclination angle of the side surface is less than 70 degrees, although the first electrode 142 may be evenly deposited due to the gentle inclination angle, the deposition area of a first metal may be increased, resulting in increased costs.

In addition, when the inclination angle is greater than 80 degrees and close to vertical, the step coverage of the first electrode may be defective and the possibility of occurrence of a short circuit may be increased.

That is, when the inclination angles θ2 and θ4 of the side surface of the second mesa area range from 70 degrees to 80 degrees, the step coverage of the first electrode 142 may be improved, and the insulation layer 150, which is formed on the first mesa area and the second mesa area, as well as the first electrode 142 may be deposited to an even thickness.

On the other hand, in the embodiment of FIG. 2, when the inclination angles at opposite sides of the second mesa area are different, the relationship θ4≥θ2 may be established. Even in this case, the inclination angles θ2 and θ4 at opposite sides may range from 70 degrees to 80 degrees.

However, when the inclination angle θ2 is maintained so as to be equal to or less than the inclination angle θ4, the first electrode 142, which is formed on the side surface of the second mesa area, may have an even thickness, and the insulation layer 150, which is subsequently formed on the first electrode 142, may have an even thickness.

FIGS. 3A and 3B are respectively a perspective view and a plan view of the light emitting element of the embodiment.

Referring to FIG. 3A, the first electrode 142 may be formed along a stepped portion on the side surface of the second mesa area. That is, the first electrode 142 may be formed along the stepped portion of the second mesa area so as to continuously extend along the upper surface of the second mesa area and the side surface of the second mesa area and then extend from the side surface of the second mesa area.

In addition, the light emitting element may be a microscale light emitting diode (μ-LED). Such a μ-LED of the embodiment may be formed so as to be smaller than general light emitting elements. Referring to the plan view of FIG. 3B, the horizontal length Wa and the vertical length Wb of the light emitting element may respectively be within 100 μm. For example, the light emitting element of the embodiment may have a rectangular shape having a horizontal length Wa of 82 μm and a vertical length Wb of 30 μm.

The light emitting element of the above-described embodiment or a light emitting element array in which a plurality of light emitting elements of the embodiment is arranged may be used in an apparatus that requires accuracy due to the small size thereof, and the productivity of the light emitting element may be improved when the first electrode is formed as an even layer on the second mesa area so as to reduce the incidence of defects due to poor step coverage.

FIG. 4 is a view illustrating an embodiment of an electron beam deposition apparatus (E-beam evaporator).

The electron beam deposition apparatus 1000 of the embodiment may be an apparatus that forms the first electrode 142 of the light emitting element described above.

The electron beam deposition apparatus 1000 may include a thermal electron emitter 430, a source feeder 440, and a dome unit 500, and the dome unit 500 may include a plurality of substrate holders 300.

The thermal electron emitter 430 may include a thermionic filament, which discharges electrons upon receiving high-voltage current.

An electron beam, which is discharged when current is supplied to the thermionic filament, may be guided by a magnetic field formed by an electromagnet and may be concentrated on a deposition material.

That is, the electron beam, which is supplied from the thermal electron emitter 430 and has high energy, may be changed in path by the magnetic field formed by the electromagnet, and may be concentrated on and transmitted to the source feeder 440.

The source feeder 440 may include a material that is to be deposited on a substrate using the electron beam deposition apparatus. The deposition material may be deposited on the substrate by being evaporated after being heated by thermal electrons.

The source feeder 440 may include a water-cooled crucible 460 in which the deposition material is stored.

In the water-cooled crucible, a solid-state deposition material 444 may be stored before evaporation. In the center portion of the source feeder 440, a molten-state deposition material 442, which has been heated by thermal electrons supplied from the thermal electron emitter 430, may be stored.

The molten-state deposition material 442 may be evaporated in the source feeder 440 so that a thin layer is formed on a substrate.

The dome unit 500, which includes the substrate holders 300 on which the substrate is mounted, may be spaced upward apart from the source feeder 440.

For example, the dome unit 500 may be disposed above the source feeder 440 so as to be spaced apart from the source feeder 440 to the height that the deposition material, evaporated in and discharged from the source feeder 440, may reach.

In addition, the dome unit 500 may be rotatable in order to allow the deposition material to be evenly deposited on the substrate mounted on the dome unit.

FIG. 4 schematically illustrates the cross section of the electron beam deposition apparatus. Referring to FIG. 4, the dome unit 500 may have a conical shape, the width of which gradually increases from the top to the bottom.

Accordingly, the side surface of the dome unit may have an inclination angle θ1 relative to the lower surface of the dome unit. For example, the side surface of the dome unit may have an inclination angle within a range from 10 degrees to 15 degrees relative to the lower surface of the dome unit.

FIG. 5 is a view schematically illustrating the upper surface of the dome unit 500.

That is, FIG. 5 is a plan view illustrating the dome unit 500 including the substrate holders 300 when viewed from the top side.

Referring to FIG. 5, the substrate holders 300 may be disposed close to the lower portion of the dome unit. For example, the substrate holders 300 may be arranged at a constant interval along the lower circumference of the dome unit.

FIG. 6 is a view illustrating the substrate holder 300 of an embodiment.

Referring to FIG. 6, the substrate holder 300 may include a stationary jig 310 and a variable jig 330.

The stationary jig 310 and the variable jig 330 of the substrate holder 300 may have a ring shape, the center portion of which is perforated in order to mount the substrate therein, and the substrate for deposition of a thin layer may be fixed to the stationary jig 330.

The diameter of the variable jig 330 may be less than the diameter of the stationary jig 310. For example, the outer diameter of the variable jig 330 may be less than the inner diameter of the stationary jig 310 so that the variable jig 330 may be disposed inside the ring-shaped stationary jig 310.

FIGS. 7 and 8 are views illustrating an embodiment of the variable jig 330.

FIG. 7 is a plan view of the variable jig and FIG. 8 is a cross-sectional view illustrating the side surface of the variable jig.

Referring to FIG. 7, the variable jig 330 may have a ring shape, and may have at least one screw-hole, which is formed from an outer surface 330b to an inner surface 330a of the variable jig.

The at least one screw-hole formed in the side surface of the variable jig may be disposed so as to correspond to a screw-hole in the stationary jig, which will be described below, and a fastening screw 332 may penetrate the screw-hole in the variable jig and the screw-hole in the stationary jig, which correspond to each other, so as to connect the holes to each other.

For example, referring to FIG. 7, two screw-holes may be formed in the side surface of the variable jig, and the two screw-holes may be formed in the circumference of the variable jig so as to face each other.

Referring to the cross-sectional view of FIG. 8, the inner surface 330a of the variable jig may have a stepped portion A, and the substrate may be disposed so as to be seated on the stepped portion A.

For example, the substrate S may be disposed so that a deposition surface a thereof, on which a thin layer will be formed, faces the inner surface 330a having the stepped portion A.

FIGS. 9 and 10 are views illustrating an embodiment of the stationary jig 310.

FIG. 9 is a plan view of the stationary jig and FIG. 10 is a view illustrating the side surface of the stationary jig.

Referring to FIG. 9, a screw-hole may be formed from an inner surface 310a to an outer surface 310b of the stationary jig, and the fastening screw 332 may be disposed in the screw-hole. Here, the stationary jig and the variable jig may be disposed so that at least one screw-hole formed in the side surface of the stationary jig corresponds to the screw-hole in the variable jig described above.

In addition, a fixing piece 312 may be disposed on the stationary jig in order to fix the fastening screw, which is disposed so as to penetrate the screw-hole.

For example, the fixing piece 312 may be brought into contact with the fastening screw 332 through a through-hole formed in the upper surface of the stationary jig 310. Meanwhile, each of the fixing piece 312 and the through-hole formed in the stationary jig may be internally provided with screw-threads.

Referring to FIG. 10, when viewing the stationary jig 310 from the lateral side, the fixing piece 312 may protrude from the stationary jig 310.

FIG. 11 is a plan view of the substrate holder according to an embodiment.

FIG. 11 is a view illustrating an embodiment of the substrate holder including the stationary jig and the variable jig.

As described above, at least one screw-hole may be provided in each of the side surface of the stationary jig 310 and the side surface of the variable jig 330.

The stationary jig and the variable jig may be disposed so that the screw-holes formed respectively in the stationary jig 310 and the variable jig 330 correspond to each other, and the fastening screw 332 may penetrate the respective screw-holes so as to connect the two jigs to each other.

Meanwhile, the substrate may be mounted on the variable jig 330, and at least one fixing pin 336 may be disposed on one side of the variable jig in order to prevent the mounted substrate from being separated to one side.

The fixing pin 336 may be fixed at one side thereof to a reference fin 334, which is disposed on the variable jig 330.

The variable jig 330 may be coupled at one or more points thereof to the stationary jig 310, and the variable jig may be fixed to have an inclination angle relative to the stationary jig.

For example, referring again to FIG. 6, the variable jig 330 may be coupled and fixed to the stationary jig 310 at two points that face each other, and the variable jig and the stationary jig, which have a ring shape, may not be disposed in the same plane, but the variable jig 330 and the stationary jig 310 may be fixed to have a predetermined angle therebetween.

FIG. 12 is a view illustrating any one substrate holder 300 among the substrate holders disposed on the dome unit of the embodiment.

In FIG. 12, the portion inside a square dotted-line area may be a portion of the dome unit that includes one substrate holder 300.

Referring to FIG. 12, the stationary jig 310 may be mounted on and fixed to the dome unit of the electron beam deposition apparatus.

In addition, the variable jig 330 may be coupled and fixed at one or more points thereof to the stationary jig 310, and the substrate S for the deposition of a thin layer may be disposed inside the variable jig 330.

FIG. 12 illustrates a portion of the upper surface of the dome unit including the substrate holder 300, and in the electron beam deposition apparatus, the substrate S mounted on the substrate holder 300 may be disposed so that the upper surface of the substrate, which is the deposition surface, faces the lower side of the dome unit.

FIG. 13 is a view illustrating an embodiment of an inclination angle measurement device 600.

The inclination angle measurement device 600 may be formed so as to be separably coupled to the dome unit of the electron beam deposition apparatus.

For example, the inclination angle measurement device may be used to measure the inclination angle of the variable jig relative to the stationary jig. After the variable jig is fixed to have a predetermined inclination angle, the inclination angle measurement device may be separated from the dome unit.

That is, while a deposition process is performed in the electron beam deposition apparatus, the inclination angle measurement device may remain separated from the dome unit.

The inclination angle measurement device 600 may be configured such that gradations 620 for angle measurement are marked on a plastic plate 610. For example, the inclination angle measurement device may be formed of a transparent plastic material, and specifically, may be formed of acryl or polycarbonate, for example.

FIG. 14 is a view illustrating a portion of the dome unit to which the inclination angle measurement device 600 is attached.

As illustrated in FIG. 14, in the state in which the inclination angle measurement device 600 is mounted, the variable jig 330 may be fixed to have an inclination angle θs relative to the stationary jig 310.

The variable jig is rotatable about a portion thereof coupled to the stationary jig. The variable jig may be adjusted to have an inclination angle within a range from 0 degrees to 90 degrees relative to the stationary jig.

For example, the variable jig 330 may be fixed to have an inclination angle within a range from 30 degrees to 45 degrees relative to the stationary jig 310. When the inclination angle of the variable jig is maintained within a range from 30 degrees to 45 degrees, the step coverage of a thin layer, which is deposited on the deposition substrate and has a stepped pattern, may be improved.

In the embodiment of the electron beam deposition apparatus described above, since the angle at which the variable jig is disposed may be freely adjusted, the angle at which the variable jig is disposed may be changed according to the type of deposition material supplied from the source feeder during a deposition process or the thickness and pattern of a deposition layer to be formed on the substrate.

In addition, when a thin layer is formed on the substrate using the electron beam deposition apparatus including the variable jig, a deposition layer having an even thickness may be acquired, and the uniformity of the deposition layer, even that of a stepped pattern, may be improved.

The light emitting element of the embodiment described above may be included in a wearable apparatus.

For example, the light emitting element of the embodiment or a light emitting element array including a plurality of light emitting elements of the embodiment may be included in a smart watch.

The smart watch may perform paring with an external digital device, and the external digital device may be a digital device that is connectable for communication with the smart watch. For example, the external digital device may include a smart phone, a laptop computer, or an Internet protocol television (IPTV).

As a light source of the smart watch, the light emitting element of the embodiment described above or a light emitting element array in which a plurality of light emitting elements of the embodiment is arranged on a flexible printed circuit board (FPCB) may be used.

In the case of a smart watch including the light emitting element of the embodiment, it is wearable on the wrist owing to a reduced size of the light emitting element and the flexibility of the FPCB, and may realize a micro pixel owing to the micro size of the light emitting element.

Hereinafter, as an embodiment including the light emitting element of the embodiment described above, an image display apparatus and a lighting apparatus will be described.

On the optical path of the light emitting element according to the embodiment, optical members such as, for example, a light guide plate, a prism sheet, and a diffuser sheet may be disposed. The light emitting element, the substrate, and the optical members may function as a backlight unit.

In addition, a display apparatus, an indicator apparatus, or a lighting apparatus including the light emitting element according to the embodiment may be realized.

Here, the display apparatus may include a bottom cover, a reflector disposed on the bottom cover, a light guide plate disposed in front of the light emitting element, which emits light, and the reflector so as to guide the light emitted from the light emitting element to the front side, an optical sheet including prism sheets disposed in front of the light guide plate, a display panel disposed in front of the optical sheet, an image signal output circuit connected to the display panel so as to supply an image signal to the display panel, and a color filter disposed in front of the display panel. Here, the bottom cover, the reflector, the light emitting device array, the light guide plate, and the optical sheet may construct a backlight unit.

In addition, the lighting apparatus may include a light source module having a substrate and the light emitting element according to the embodiment, a heat radiator configured to dissipate heat from the light source module, and a power supply unit configured to process or convert an electrical signal provided from the outside so as to supply the same to the light source module. For example, the lighting apparatus may include a lamp, a headlamp, or a street light.

In the case of the image display apparatus and the lighting apparatus described above, through the provision of the light emitting element according to the above-described embodiment, the size of the apparatus may be reduced and limitations on design may be reduced due to the flexibility of the light emitting device array.

Although the exemplary embodiments have been illustrated and described as above, it will of course be apparent to those skilled in the art that the embodiments are provided to assist understanding and the embodiments are not limited to the above description, and various modifications and variations can be made in the embodiments without departing from the spirit or scope of the disclosure, and the modifications and variations should not be understood individually from the viewpoint or scope of the disclosure so long as they include the constituent elements set forth in the claims.

INDUSTRIAL APPLICABILITY

An electron beam deposition apparatus of embodiments includes a variable jig so as to enable free adjustment of the angle at which a substrate is disposed so as to be fixed to a substrate holder, and therefore has industrial applicability.

The invention claimed is:

1. A light emitting element comprising:
a light emitting structure including a first conductive semiconductor layer, an active layer, and a second conductive semiconductor layer; and
first and second electrodes disposed respectively on the first and second conductive semiconductor layers,
wherein the light emitting structure includes a first mesa area, and the first conductive semiconductor layer includes a second mesa area,
wherein the first electrode includes:
a first area on a portion of an upper surface of the second mesa area;
a second area on a side surface of the second mesa area; and
a third area disposed so as to extend from an edge of the side surface of the second mesa area,
wherein a bottom surface of the first conductive semiconductor layer is on a same plane as a bottom surface of the first electrode, the third area of the first electrode including the bottom surface, and
wherein the side surface of the second mesa area has an inclination angle within a range from 70 degrees to 80 degrees relative to a bottom surface of the first conductive semiconductor layer.

2. The light emitting element according to claim 1, wherein the first area, the second area, and the third area have a thickness ratio as follows:
d1:d2:d3=1:0.9-1.1:1
(where d1 is a thickness of the first area, d2 is a thickness of the second area, and d3 is a thickness of the third area).

3. The light emitting element according to claim 1, wherein a side surface of the first mesa area has an inclination angle within a range from 70 degrees to 90 degrees relative to the upper surface of the second mesa area.

4. The light emitting element according to claim 1, wherein the horizontal length and the vertical length of the light emitting element is respectively within 100 μm.

5. The light emitting element of claim 1, wherein an entirety of the second electrode is substantially planar.

6. The light emitting element of claim 1, wherein the second mesa overlaps an entirety of the first mesa.

7. The light emitting element of claim 6, wherein the second mesa has a greater cross-sectional length and cross-sectional width than the first mesa.

8. The light emitting element of claim 1, wherein each of the first area of the first electrode and the third area of the first electrode is substantially planar.

9. The light emitting element of claim 1, wherein each of the first area of the first electrode and the third area of the first electrode is substantially rectangular.

10. The light emitting element of claim 1, wherein the second area of the first electrode extends between the first area of the first electrode and the third area of the first electrode, and
wherein the second area of the first electrode is inclined with respect to the first area of the first electrode and the third area of the first electrode.

11. The light emitting element of claim 1, wherein, with regard to an inclination angle of the side surface of the second mesa area relative to the bottom surface of the first conductive semiconductor layer, an inclination angle in a portion in which the first electrode is disposed is equal to an inclination angle in a portion in which no first electrode is disposed.

12. The light emitting element of claim 1, wherein the light emitting element further comprises an insulation layer disposed on the light emitting structure exposed between the first electrode and the second electrode, and
wherein the side surface of the second mesa area of the first electrode is in direct contact with a side surface of the first conductive semiconductor layer.

* * * * *